(12) United States Patent
Subramanian et al.

(10) Patent No.: US 6,541,184 B1
(45) Date of Patent: Apr. 1, 2003

(54) NOZZLE ARM MOVEMENT FOR RESIST DEVELOPMENT

(75) Inventors: Ramkumar Subramanian, San Jose, CA (US); Khoi A. Phan, San Jose, CA (US); Bharath Rangarajan, Santa Clara, CA (US); Bhanwar Singh, Morgan Hill, CA (US); Michael K. Templeton, Atherton, CA (US); Sanjay K. Yedur, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/655,979

(22) Filed: Sep. 6, 2000

Related U.S. Application Data

(62) Division of application No. 09/429,995, filed on Oct. 29, 1999.

(51) Int. Cl.$^7$ .......................... G03C 5/56; B05C 11/02; B05C 11/08
(52) U.S. Cl. ........................ 430/311; 430/320; 430/395; 118/663; 118/665; 118/681
(58) Field of Search .......................... 430/320, 311, 430/395; 118/663, 665, 681

(56) References Cited

U.S. PATENT DOCUMENTS

| | | | | |
|---|---|---|---|---|
| 4,564,280 A | * | 1/1986 | Fukuda | 118/321 |
| 5,089,305 A | * | 2/1992 | Ushijima et al. | 118/302 |
| 5,129,955 A | | 7/1992 | Tanaka | 134/2 |
| 5,275,658 A | | 1/1994 | Kimura | 118/302 |
| 5,474,877 A | | 12/1995 | Suzuki | 430/325 |
| 5,555,234 A | | 9/1996 | Sugimoto | 354/317 |
| 5,625,433 A | | 4/1997 | Inada et al. | 396/604 |
| 5,645,884 A | | 7/1997 | Harlow, Jr. et al. | 427/8 |
| 5,678,116 A | | 10/1997 | Sugimoto et al. | 396/611 |
| 5,820,677 A | | 10/1998 | Yonaha | 118/680 |
| 5,826,130 A | | 10/1998 | Tanaka et al. | 396/611 |
| 5,885,755 A | | 3/1999 | Nakagawa et al. | 430/325 |
| 5,939,130 A | * | 8/1999 | Shiraishi et al. | 118/52 |
| 5,942,037 A | | 8/1999 | Wagener et al. | 118/315 |
| 5,962,070 A | | 10/1999 | Mitsuhashi et al. | 427/240 |

* cited by examiner

Primary Examiner—Mark F. Huff
Assistant Examiner—Daborah Chacko Davis
(74) Attorney, Agent, or Firm—Amin & Turocy, LLP

(57) ABSTRACT

A system and method is provided that facilitates the application of a uniform layer of developer material on a photoresist material layer. The system includes a multiple tip nozzle and a movement system that moves the nozzle to an operating position above a central region of a photoresist material layer located on a substrate, and applies a volume of developer as the nozzle scan moves across a predetermined path. The movement system moves the nozzle in two dimensions by providing an arm that has a first arm member that is pivotable about a first rotational axis and a second arm member that is pivotable about a second rotational axis or is movable along a translational axis. The system also provides a measurement system that measures the thickness uniformity of the developed photoresist material layer disposed on a test wafer. The thickness uniformity data is used to reconfigure the predetermined path of the nozzle as the developer is applied. The thickness uniformity data can also be used to adjust the volume of developer applied along the path and/or the volume flow rate.

7 Claims, 9 Drawing Sheets

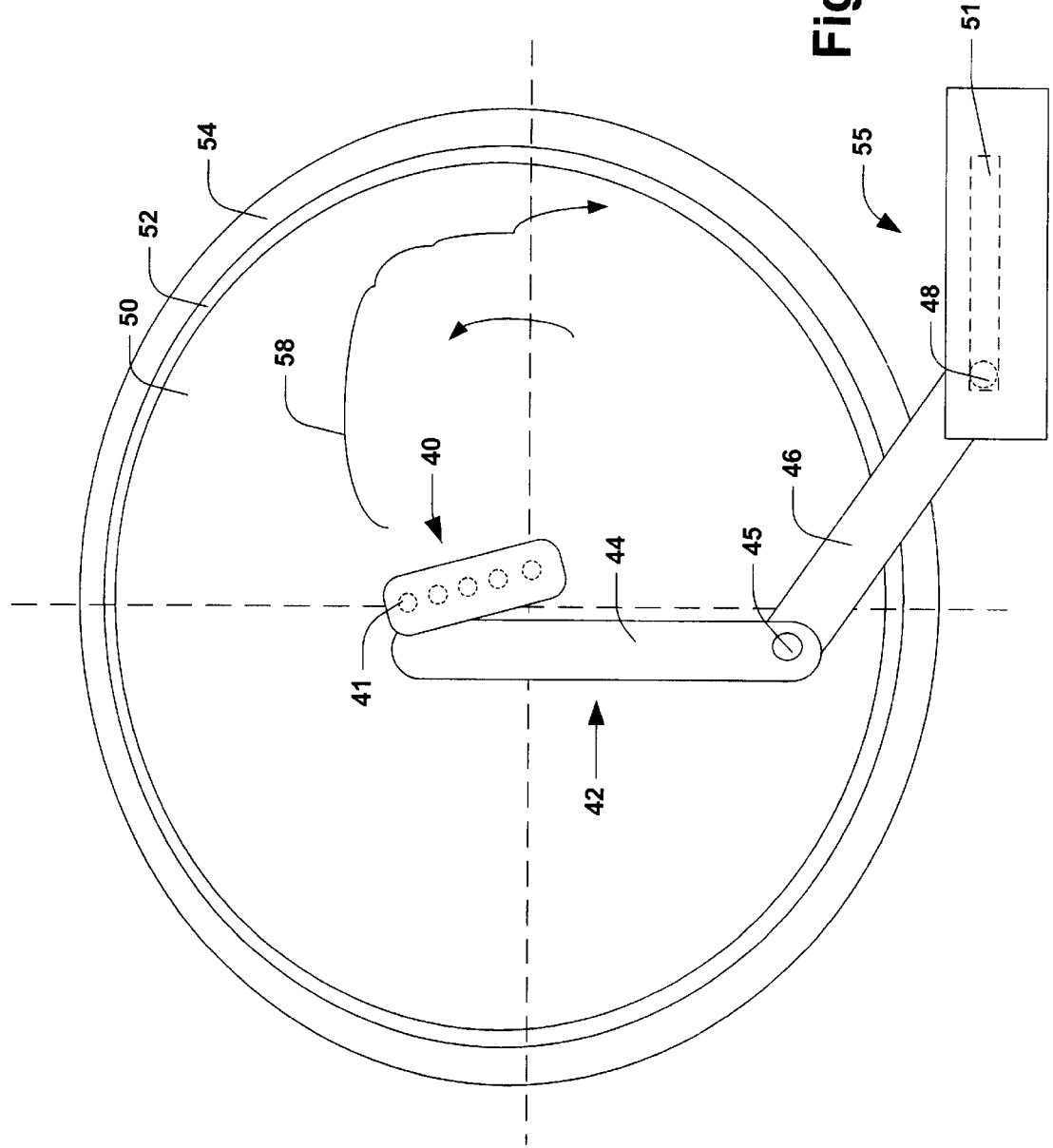

NOZZLE ARM MOVEMENT FOR RESIST DEVELOPMENT

This is a Division of Application Ser. No. 09/429,995 filed Oct. 29, 1999.

TECHNICAL FIELD

The present invention generally relates to semiconductor processing, and in particular to a system for uniform development of a photoresist material layer on a wafer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon structure is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist material, thickness uniformity of the photoresist material is a significant factor in achieving desired critical dimensions. The photoresist material should be applied such that a uniform thickness is maintained in order to ensure uniformity and quality of the photoresist material layer. The photoresist material layer thickness typically is in the range of 0.1 to 3.0 microns. Good resist thickness control is highly desired, and typically variances in thickness should be less than±10-20Å across the wafer. Very slight variations in the photoresist material thickness may greatly affect the end result after the photoresist material is exposed by radiation and the exposed portions removed.

Application of the resist onto the wafer is typically accomplished by using a spin coater. The spin coater is essentially a vacuum chuck rotated by a motor. The wafer is vacuum held onto the spin chuck. Typically, a nozzle supplies a predetermined amount of resist to a center area of the wafer. The wafer is then accelerated to and rotated at a certain speed, and centrifugal forces exerted on the resist cause the resist to disperse over the whole surface of the wafer. The resist thickness obtained from a spin coating process is dependent on the viscosity of the resist material, spin speed, the temperature of the resist and temperature of the wafer.

After the resist is spin coated and selectively irradiated to define a predetermined pattern, the irradiated or nonirradiated portions are removed by applying a developer. The developer is also spin coated onto the wafer by applying developer across the resist and then spin coating the developer until centrifugal forces disperse the developer over the coating of resist. However, the developer is not always uniformly dispersed on the wafer because of the difference of the surface area on the outer peripheral portion of the wafer in comparison to the center portion of the wafer. This may cause overdeveloping of the center portion of the resist on the wafer forming a developed resist layer with a thickness that is smaller at the center than at the outer peripheral surfaces. The result is the predetermined photoresist pattern cannot be formed.

The above stated problems even occur for nozzles that are designed to dispense developer more uniformly, such as a multiple tip dispensing nozzles. Typically, a multiple tip dispensing nozzle includes a chamber for receiving developer that distributes developer to a plurality of nozzles distributed over the length of the nozzle. Typically, the nozzle is connected to a moving mechanism by an arm. The arm moves from a rest position outside the wafer to an operating position over the center of the wafer. The nozzle is aligned such that different annular rings around the wafer receive developer, which is then spin coated onto the wafer. In some cases, the nozzle scan moves along a path as it dispenses developer to provide a more uniformly thick layer of developer on the photoresist material layer.

A prior art developer nozzle application system is illustrated in FIG. 1a. A multiple tip nozzle 10 is coupled to a pivotable arm 12 that pivots from a rest position 11 to an operating position 13. In the operating position 13, the multiple tip nozzle applies a developer on a resist layer 24 disposed on a wafer 22. The wafer 22 is vacuum held onto a rotating chuck 20 driven by a shaft coupled to a motor (not shown). The wafer 22 with its coating of resist 24 is rotated at a constant speed and the developer is applied through a plurality of tips 14 at different points along a radial line 30, so that developer is applied along different annular rings (not shown). The developer flows outward from each annular ring covering the entire top surface of the photoresist material layer 24. Although this type of application system improves the thickness uniformity of the coating of developer as opposed to moving a single nozzle over the center of the wafer, it does not always provide for the optimal thickness uniformity of the developer coating.

FIG. 1b illustrates an alternate prior art application system attempting to improve on the application system illustrated in FIG. 1a. The multiple tip nozzle 10 is coupled to the pivotable arm 12 on a slight angle. The nozzle moves horizontally from a rest position 15 to an operating position 17. In the operating position 17, the multiple tip nozzle begins to apply a developer on the photoresist material layer 24, and then scan moves the nozzle 10 from the center to the outer perimeter of the wafer 22, until the nozzle returns to the rest position 15. The wafer 22 with its coating of resist 24 is rotated at a constant speed and the developer is applied through a plurality of tips 14 along a translational path 32 The tips 14 are aligned on an angle at different perpendicular points along the translational path 32 to apply developer along different annular rings that are closer together than those that were discussed with reference to FIG. 1a. Although this improves the thickness uniformity of the developer coating, it does not necessarily provide for the optimal scanning path due to overlapping concentrations of developer being applied at the same general annular regions.

The resulting developer application systems illustrated in FIGS. 1a and 1b do not necessarily apply the optimal uniform thickness of developer, which may lead to a developed photoresist material layer that is not uniform and ultimately lead to impaired device performance. In view of the above, a system/method is needed, for dispensing an optimal uniformly thick layer of developer across a photoresist material layer formed on a wafer.

SUMMARY OF THE INVENTION

The present invention provides for a system and method that facilitates the application of a uniformly thick layer of developer material on a photoresist material layer. The present invention accomplishes this end by utilizing a developer application system that includes a multiple tip nozzle and a movement system that moves the nozzle to an operating position above a central region of a photoresist material layer located on a substrate, and then applies a volume of developer as the nozzle scan moves across a predetermined path. The predetermined path is defined as a two dimensional path that allows for forming a uniformly thick layer of developer on the photoresist material layer that provides a uniformly thick layer of developed or patterned photoresist material layer. This path is typically chosen based on historical data for the particular process being performed. The movement system moves the nozzle in two dimensions by providing an arm that has a first arm member that is pivotable about a first rotational axis and a second arm member that is pivotable about a second rotational axis or is movable along a translational axis.

The present invention also provides a measurement system that measures the thickness uniformity of the developed photoresist material layer disposed on a test wafer. The thickness uniformity data is used to reconfigure the predetermined path of the nozzle as the developer is applied. The thickness uniformity data can also be used to adjust the volume of developer applied along the path and/or the volume flow rate.

One particular aspect of the invention relates to a system applying a developer material onto a photoresist material layer disposed on a substrate to provide a uniformly thick layer of developer material. The developer material is spin-coated onto the substrate by a rotating chuck coupled to a motor to form the layer of developer material. The system includes a nozzle adapted to apply a developer material on the photoresist material layer, a movement system adapted to move the nozzle along a predetermined path in two dimensions and an arm including a first arm member holding the nozzle on a first end and coupled to a second arm member on a second end. The second arm member is coupled to the movement system.

Another aspect of the present invention relates to a system applying a developer material onto a photoresist material layer disposed on a substrate to provide a uniformly thick layer of developer material. The developer material is spin-coated onto the substrate by a rotating chuck coupled to a motor to form the layer of developer material. The system includes a nozzle adapted to apply the developer material on the photoresist material layer, a movement system adapted to move the nozzle along a predetermined path in two dimensions, an arm including a first arm member holding the nozzle on a first end and coupled to a second arm member on a second end. The second arm member is coupled to the movement system. The first arm member is pivotable about a first rotational axis and the second arm member is pivotable about a second rotational axis. The system also includes a measuring system adapted to measure the thickness of a developed layer of photoresist material that has been developed by applying the developer on the photoresist material layer and a processor operatively coupled to the measuring system and the movement system. The processor receives thickness data from the measuring system and the processor uses the data to reconfigure the predetermined path provided to the movement system, so that a developed layer of photoresist material having a more uniform thickness can be achieved for a subsequent substrate.

Another aspect of the present invention relates to a system applying a developer material onto a photoresist material layer disposed on a substrate to provide a uniformly thick layer of developer material. The developer material is spin-coated onto the substrate by a rotating chuck coupled to a motor to form the layer of developer material. The system includes a nozzle adapted to apply the developer material on the photoresist material layer, a movement system adapted to move the nozzle along a predetermined path in two dimensions and an arm including a first member holding the nozzle on a first end and coupled to a second arm member on a second end. The second arm member is coupled to the movement system. The first arm member is pivotable about a rotational axis and the second arm member is movable along a tranlational axis. The system also includes a measuring system adapted to measure the thickness of a developed layer of photoresist material that has been developed by applying the developer material on the photoresist material layer and a processor operatively coupled to the measuring system and the movement system. The processor receives thickness data from the measuring system and the processor uses the data to reconfigure the predetermined path provided to the movement system, so that a developed layer of photoresist material having a more uniform thickness can be achieved for a subsequent substrate.

Yet another aspect of the present invention relates to a system for applying a developer material onto a photoresist material layer disposed on a substrate to provide a uniformly thick layer of developer material. The developer material is spincoated onto the substrate by a rotating chuck coupled to a motor to form the layer of developer material. The system includes means for applying a developer material on the photoresist material layer, means for moving the means for applying the developer along a predetermined path in two dimensions and means for holding the means for applying a developer. The means for holding is movable about a first rotational axis and is movable with respect to at least one of a second rotational axis and a translational axis.

Still yet another aspect of the present invention relates to a method for applying a developer material onto a photoresist material layer disposed on a substrate to provide a uniformly thick layer of developer material. The developer material is spincoated onto the substrate by a rotating chuck coupled to a motor to form the layer of developer material. The method includes the steps of spinning the photoresist material layer at a predetermined speed, moving a nozzle to an operating position in a center region of the photoresist material layer, moving the nozzle along a predetermined path in two dimensions while applying the developer material, spin coating the substrate until the developer material forms a layer on the photoresist material layer, stopping the spinning of the substrate until the developer develops the photoresist material layer, measuring the thickness of the developed photoresist material layer at a variety of areas on the photoresist material layer and generating data based on the measurements, determining the thickness uniformity of the layer based on the data and reconfiguring the predetermined path, so that a developed layer of photoresist material having a more uniform thickness can be achieved for a subsequent substrate.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2 illustrates a top view of a developer material application system in accordance with the present invention;

DETAILED DESCRIPTION OF THE INVENTION

Figure 1A:
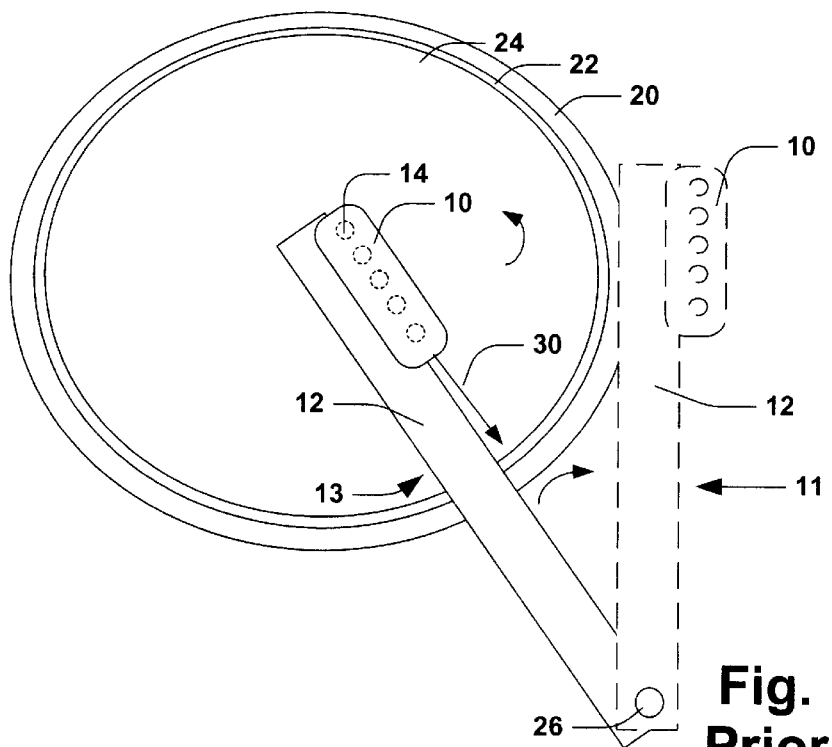
FIG. 1a illustrates a top view of a developer material application system in accordance with the prior art.
Figure 1B:
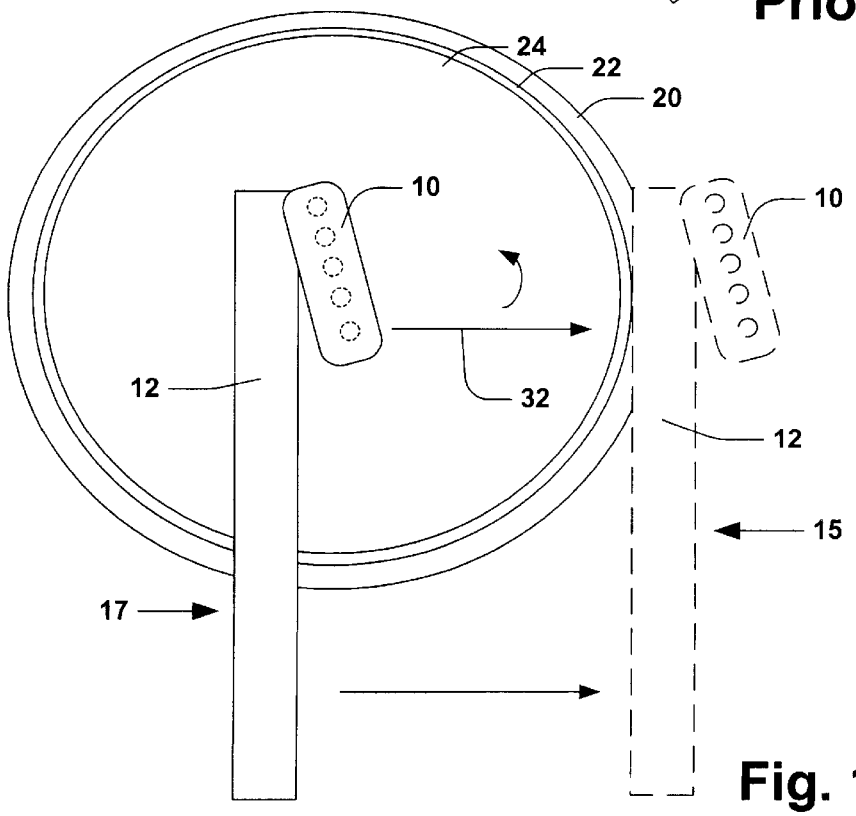
FIG. 1b illustrates a top view of another developer material application system in accordance with the prior art.

The present invention will now be described with reference to the drawings, wherein like reference numerals are used to refer to like elements throughout. The present invention will be described with reference to a system for controlling the thickness of a developer spin coated onto a photoresist material layer in order to form a uniformly thick developed or patterned photoresist. It should be understood that the description of these embodiments are merely illustrative and that they should not be taken in a limiting sense.

Referring initially to FIG. 2, a photoresist material layer 50 is formed on a wafer 52 located on a spin chuck 54. A multiple tip developer nozzle 40 is provided that is coupled to an arm 42 which is connected to a moving system 55. The moving system 55 moves the nozzle 40 in two dimensions along a path 58 that is optimal for applying a uniformly thick layer of developer and thus providing a uniformly thick layer of developed photoresist material. The arm 42 includes a first arm member 44 coupled to a second arm member 46 by a pin 45. The first arm member 42 is pivotable about a first rotatational axis through the center of the pin 45. The second arm member 46 is pivotable about a second rotational axis through the center of pin 48. Alternatively, the second arm member 46 could be rotational fixed, but be movable along a translational axis with respect to moving system 50. Both embodiments allow for two-dimensional movement of the nozzle 40. For example, the pin 48 can be a slidable rod and move along the slide bar 51 to provide for translational movement. In an alternate embodiment, the system as illustrated in FIG. 2 is modified to provide a two axis translational system for two-dimensional movement.

Figure 3:
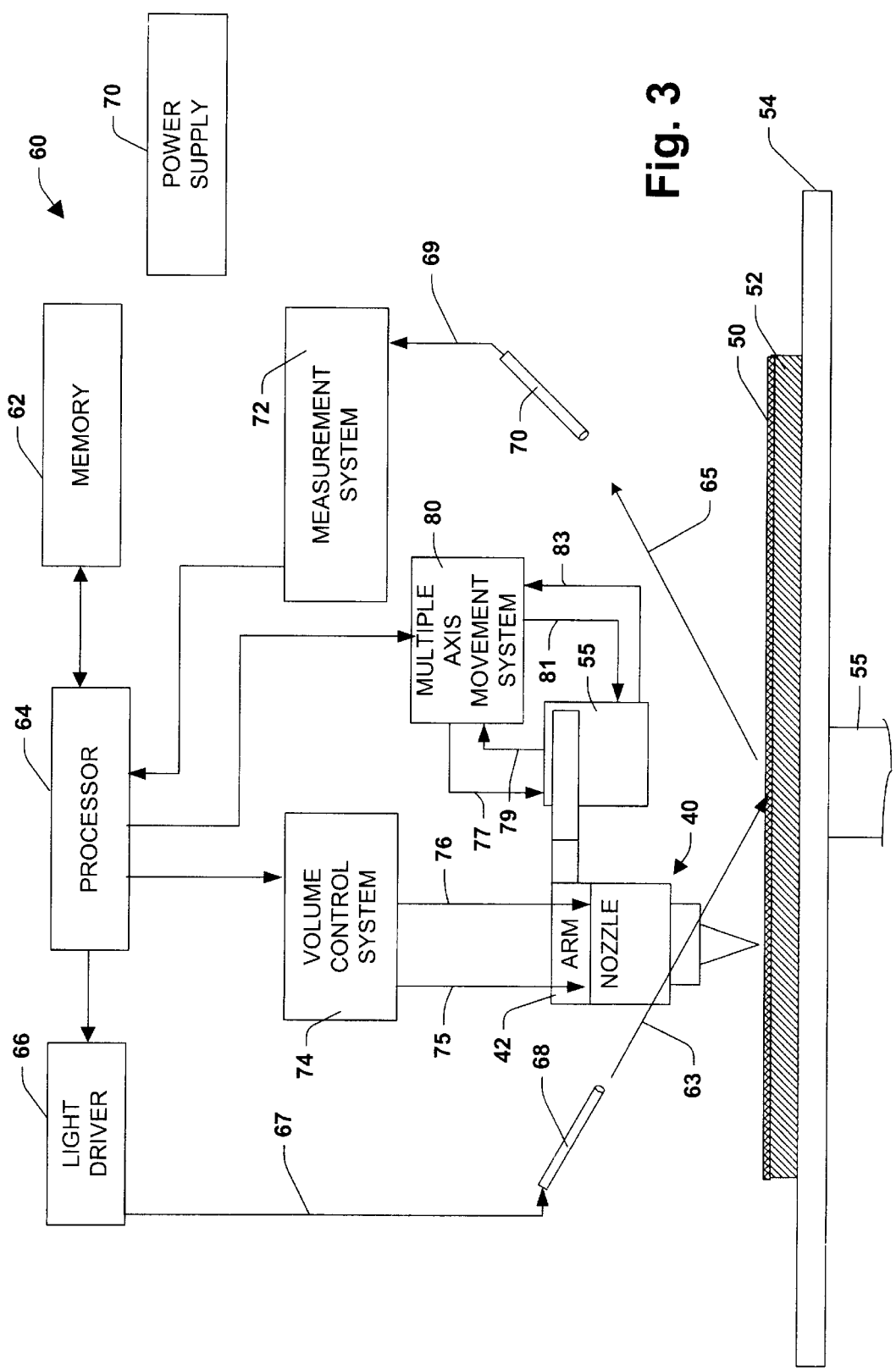
FIG. 3 illustrates a partial schematic block diagram of a measurement system, volume control system and movement system in accordance with the present invention.

In another embodiment, the developer material thickness uniformity can be further improved by tapering off the volume of developer applied on to the photoresist material layer 50 as it reaches the end of the wafer, adjusting the volume of developer material applied or adjusting the developer material flow rate. FIG. 3 illustrates a system employing the present invention for two dimensional movement in combination with adjustment of the volume or volume flow rate of the developer material applied to the photoresist material layer 50. FIG. 3 illustrates a system 60 for applying a uniformly thick layer of developer material over the photoresist material layer 50 on the substrate 52. The substrate 52 is vacuum held onto the rotating chuck 54, which is spin rotated by a shaft 55 driven by a motor (not shown). It is to be appreciated that although the present invention is primarily described within the context of uniformly applying a developer over a layer of photoresist material or achieving a uniformly thick developed photoresist material layer, it is to be understood that the present invention may be applied to applying uniform layers of top and bottom anti-reflective coatings, low K dielectric materials, spin-on-glass (SOG) and other spin-on materials.

The system 60 further includes a thickness measurement system 72. A light source 68 is connected by a fiber optic line 67 to a light driver 66. The light driver 66 is turned on and off for thickness measurements of the photoresist material layer 50 by a processor 64. The light source 68 sends a ray of light 63 at the resist layer 34, which is reflected as a ray of light 65 to a light receiver 70 which is coupled to the measurement system 72 for making resist thickness measurements. The light receiver 70 is connected to the measurement system 72 by a fiber optic line 69. In another embodiment, the light source 68 and the light receiver 70 is rotatable so that thickness measurements can be performed at various points along the photoresist material layer 50. In yet another embodiment, the light source 68 comprises a plurality of fiber optic connections and light sources and light receiver 70 includes a plurality of fiber optic connections, and light receivers for detecting thickness along different points of the resist layer.

Any suitable interferometry system and/or spectrometry system may be employed to carry out the present invention and such systems are intended to fall within the scope of the hereto appended claims. In one embodiment, the measurement system 72 is a polychromatic interferometer system or a monochromatic interferometer system to measure the resist thickness. In another embodiment, the measurement system 72 is a spectrometry system. Interferometry systems and spectrometry systems are well known in the art, and therefore further discussion related thereto is omitted for sake of brevity.

The processor 64 receives the measured data from the measuring system 72 and determines the overall thickness and the thickness uniformity of the developed photoresist material layer 50 by classical signal analysis and estimation algorithms. The processor 64 is programmed to control and operate the various components within the developer application system 60 in order to carry out the various functions described herein. The manner in which the processor 64 can be programmed to carry out the functions relating to the present invention will be readily apparent to those having ordinary skill in the art based on the description provided herein.

A memory 62 which is operatively coupled to the processor 64 is also included in the system 60 and serves to store program code executed by the processor 64 for carrying out operating functions of the system 60 as described herein. The memory 62 includes read only memory (ROM) and random access memory (RAM). The ROM contains among other code the Basic Input-Output System (BIOS) which controls the basic hardware operations of the system 60. The RAM is the main memory into which the operating system and application programs are loaded. The memory 62 also serves as a storage medium for temporarily storing information such as developer material volume settings, offset position settings, developed photoresist material coordinate tables, interferometry information, spectrometry information and other data which may be employed in carrying out the present invention. For mass data storage, the memory 62 may include a hard disk drive (e.g., 10 Gigabyte hard drive).

Power supply 70 provides operating power to the system 60. Any suitable, power supply (e.g., battery, line power) may be employed to carry out the present invention.

The processor 64 is also coupled to a volume control system 74. The volume control system 74 is operatively coupled to the nozzle 40, which applies developer to the photoresist material layer 50 located on the substrate 52. The volume of the developer applied is maintained by one or more electronically controlled valves controlled by a control line 75 and the volume flow rate of the developer applied is maintained by one or more electronically controlled valves controlled by a control line 76 of the volume control system 74.

The processor 64 is also electronically coupled to a multiple axis movement system 80 that provides movement of the arm 42 and nozzle 40 along the movement system 55. In one embodiment, the movement system 55 moves the arm 42 and the nozzle 40 utilizing a pair of stepper motors (not shown) or the like along an irregular path. The specific movement of the nozzle is provided by the processor 64 to the multiple axis movement system 80, which controls the movement of the arm 42 and nozzle 40 by a pair of control lines 77 and 81. The movement system 85 provides feedback position information via feedback lines 79 and 83 to the multiple axis movement system 80. This information can be used to correct the position of the nozzle 40 or can be communicated to the processor 64 for further analysis.

Figure 4:
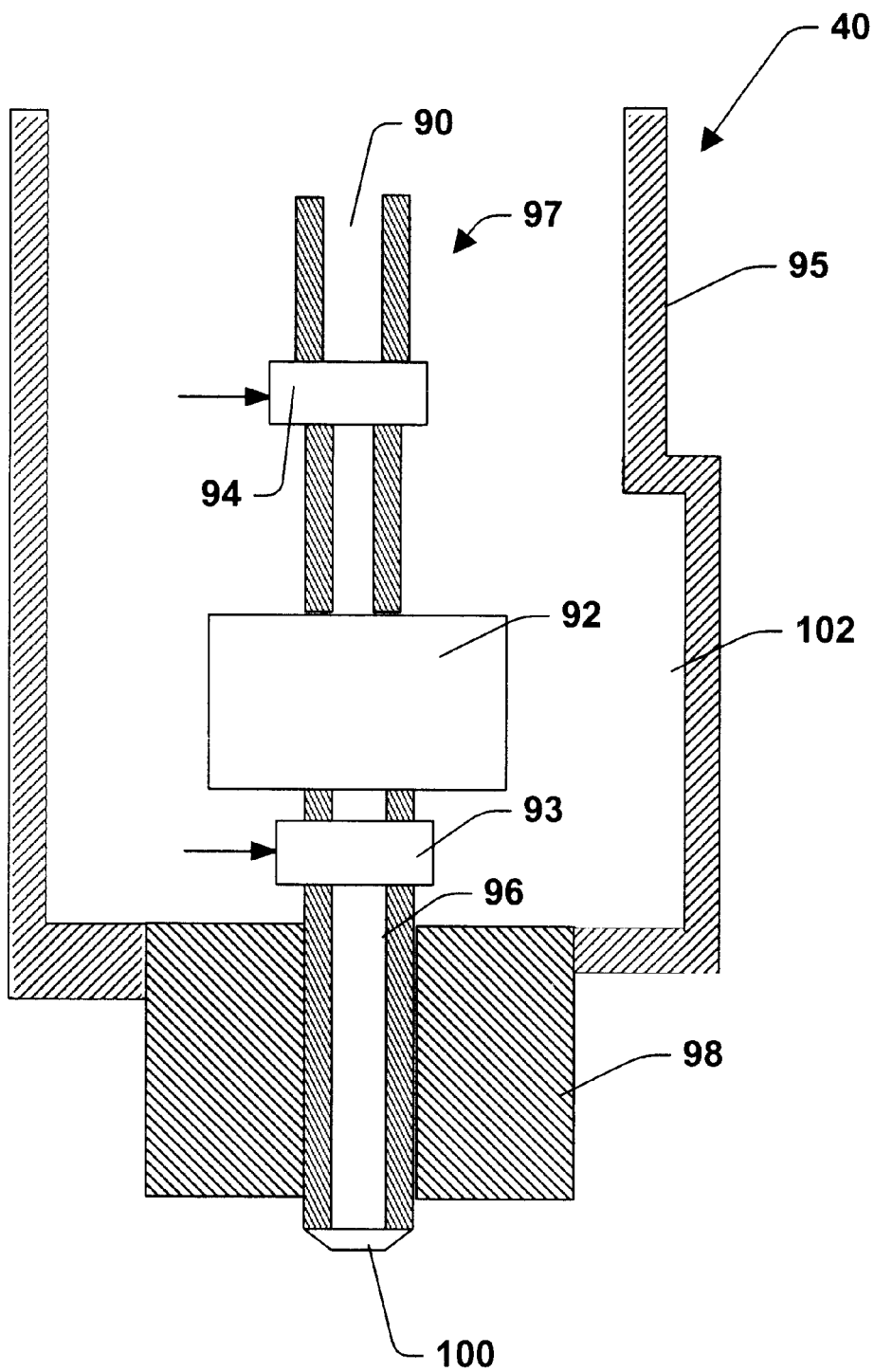
FIG. 4 illustrates a cross-sectional view of a nozzle in accordance with the present invention.

Referring now to FIG. 4, the nozzle 40 includes a holder 95 defining a chamber 102 that holds a plurality of nozzle tips assemblies 97. Each nozzle tip assembly 97 includes a developer supply tube 90 with one end disposed in the holder 95 and the other end connected to a supply of developer material (not shown). A volume control valve 94 controls the volume of developer received into a receiving chamber 92 from the developer supply tube 90. A collar 98 is connected to the bottom of the holder 95 and includes a central aperture for allowing a development supply barrel 96 to pass therethrough. The collar 98 threadingly engages the holder 98. Supply barrel 96 is connected to the receiving chamber 92 on one end and passes through the center of collar 98. The supply barrel 96 includes a liquid discharge opening 100 that discharges the developer to the photoresist material layer 50. A predetermined volume of developer is received in the receiving chamber 92 depending on the setting of the volume control valve 94. The chamber 92 and the tip 100 cooperate to deposit developer at a controlled flow rate on to the photoresist material layer 50. A second control valve 93 could be placed between the receiving chamber 92 and the liquid discharge opening 100 for selectively controlling the developer flow rate from the receiving chamber to the photoresist material layer. In one embodiment, a single receiving chamber is used to supply developer to the plurality of nozzle tips and supply barrels.

Figure 5:
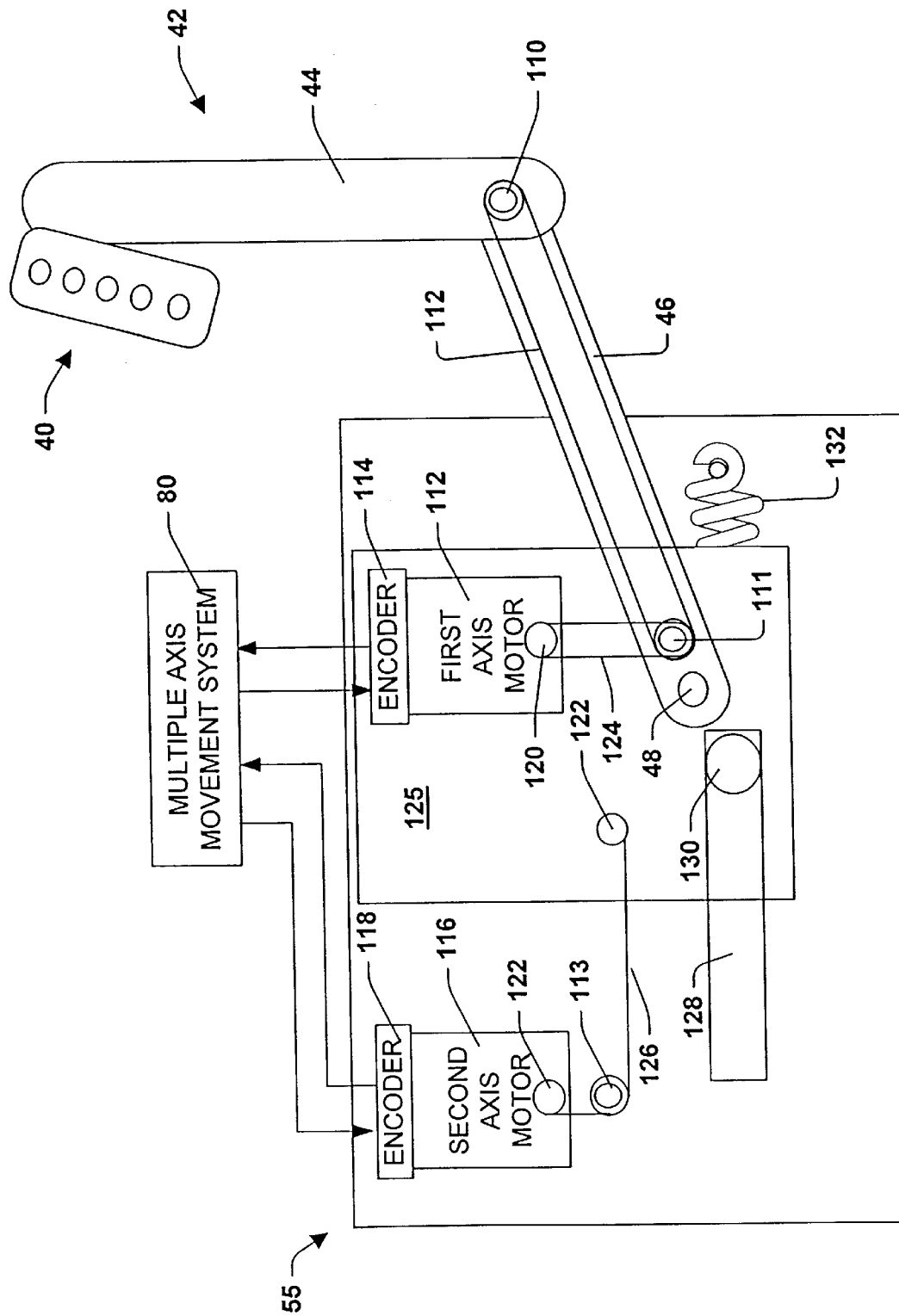
FIG. 5 illustrates a partial schematic block diagram of one particular embodiment of the movement system in accordance with the present invention.

FIG. 5 illustrates one embodiment of the movement system 55 coupled to the arm 42 that holds the nozzle 40. The first arm member 44 includes a roller 110 coupled to a roller 111 on the second arm member 46 by a belt 112. A second belt 124 is connected to the roller 111 on the second arm member 46 to a shaft 120 on a first axis motor 112. The first axis motor 112 allows for pivotable movement of the member 44 about a rotational axis through the center of roller 110. An encoder 114 is coupled to the first axis motor 112 for receiving position information from the multiple axis movement system 80, and for sending actual position information to the multiple axis movement system 80. The first axis motor 112 and the second arm member 46 are fixed to a movable plate 125. The second arm member 46 is held in a fixed position by the pin 48. The movable plate 125 is slidable along a translational axis for translational movement of the arm 42. The movable plate 125 includes a slide rod 130 that slides along a slide bar 128. The movable plate also includes a fixed rod 122 that is coupled to a shaft 122 of a second axis motor 116 via a belt 126. The belt 126 is fixed at one end to the fixed pin 122, wrapped around a roller 113 and attached to the shaft 122 of the second axis motor 116. The movable plate 125 is spring biased in the operating position by a spring 132, and is moved in a horizontal direction by the first axis motor 116, until it reaches the resting position. An encoder 118 is coupled to the second axis motor 116 for receiving position information from the multiple axis movement system 80, and for sending actual position information to the multiple axis movement system 80. The movement system 55 provides for both rotational and translational movement of the first arm member 44. The nozzle 40 can therefore be moved along any path in two dimensions by movement of the arm 42 in a translational direction and movement of the first arm member 44 in a rotational direction. In some situations, interpolation can be used to calculate the next location along the desired path.

Figure 6:
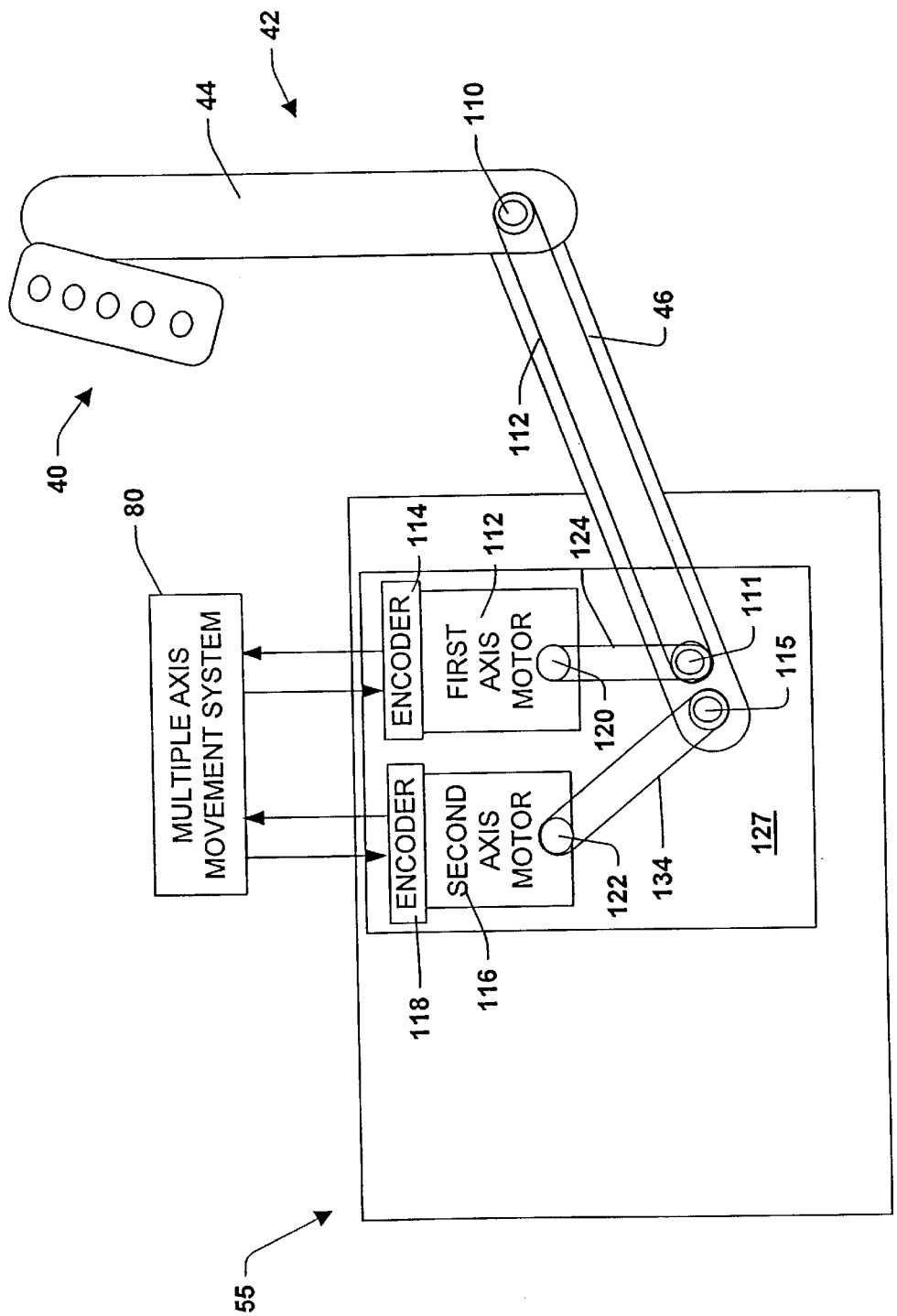
FIG. 6 illustrates a partial schematic block diagram of another particular embodiment of the movement system in accordance with the present invention.

FIG. 6 illustrates an alternate embodiment of the movement system 55 coupled to the arm 42 that holds the nozzle 40. As illustrated in FIG. 5, the first arm member 44 includes the roller 110 coupled to the roller 111 on the second arm member 46 by the belt 112. The second belt 124 is connected to the roller 111 on the second arm member 46 to the shaft 120 on the first axis motor 112. The first axis motor 112 allows for pivotable movement of the arm member 44 about a rotational axis through the center of the roller 110. The encoder 114 is coupled to the first axis motor 112 for receiving position information from the multiple axis movement system 80, and for sending actual position information to the multiple axis movement system 80. However, a third belt 134 is coupled to a roller 115 connected to the second arm member 46 and the shaft 122 of the second axis motor 116. This allows for pivotable movement of the second arm member 46 about a second rotational axis through the center of the roller 115. The first axis motor 112 and the second axis motor 116 are attached to a fixed plate 127. Again, the encoder 118 is coupled to the second axis motor 116 for receiving position information from the multiple axis movement system 80, and for sending actual position information to the multiple axis movement system 80. The movement system 55 as illustrated in FIG. 6 allows for rotational movement of the first arm member 44 about the first rotational axis and the rotational movement of the second arm member 46 and ultimately the arm 42 about the second rotational axis to provide for two dimensional movement of the nozzle 40.

Figure 7:
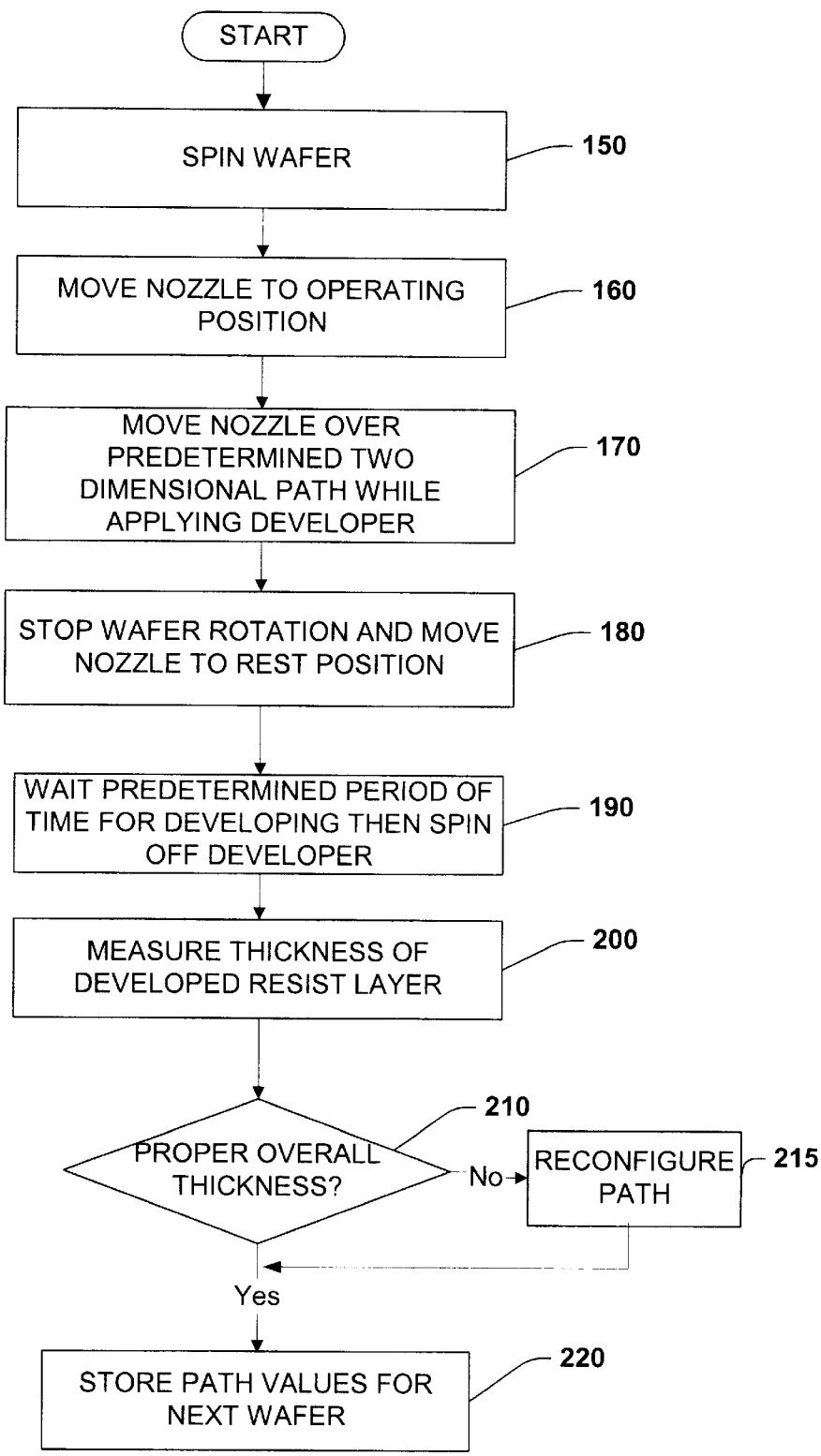
FIG. 7 is a flow diagram illustrating one specific methodology for carrying out the movement system in accordance with the present invention.

FIG. 7 is a flow diagram illustrating one particular methodology for carrying out the present invention. In step 150, the test wafer 52 with the photoresist material layer 50 is rotated on the rotating chuck 54, and the processor 64 performs a general initialization routine to the developer application system 60. In step 160, the nozzle 40 is moved to its operating position over the center of the photoresist material layer 50. In step 170, the nozzle 40 is moved along a predetermined two dimensional path while applying developer along the path to the photoresist material layer 50. In step 180, the motor 120 is stopped, causing the wafer 52 and photoresist material layer 50 to stop rotating and the nozzle 40 is moved to its rest position. In step 190, the system 60 waits a predetermined amount of time until the developing of the photoresist material layer 50 is complete, and then rotates the wafer 52 to spin off the remaining developer. In an alternate embodiment, the developer and the irradiated or unirradiated resist portions could be rinsed off the photoresist material layer 50 using water or another available solution. The measurement system 72 then measures the thickness of the developed photoresist material layer 50 on the wafer 52 at various locations along the wafer 52 in step 200. In step 210, the processor 64 compares the measured thickness uniformity with the desired thickness uniformity, and determines whether or not the proper thickness uniformity has been achieved within predefined tolerances. If no, the processor 64 enters a routine to reconfigure the path in step 215. In step 220, the processor 64 stores the previous or reconfigured path values to be used for the next wafer.

Figure 8:
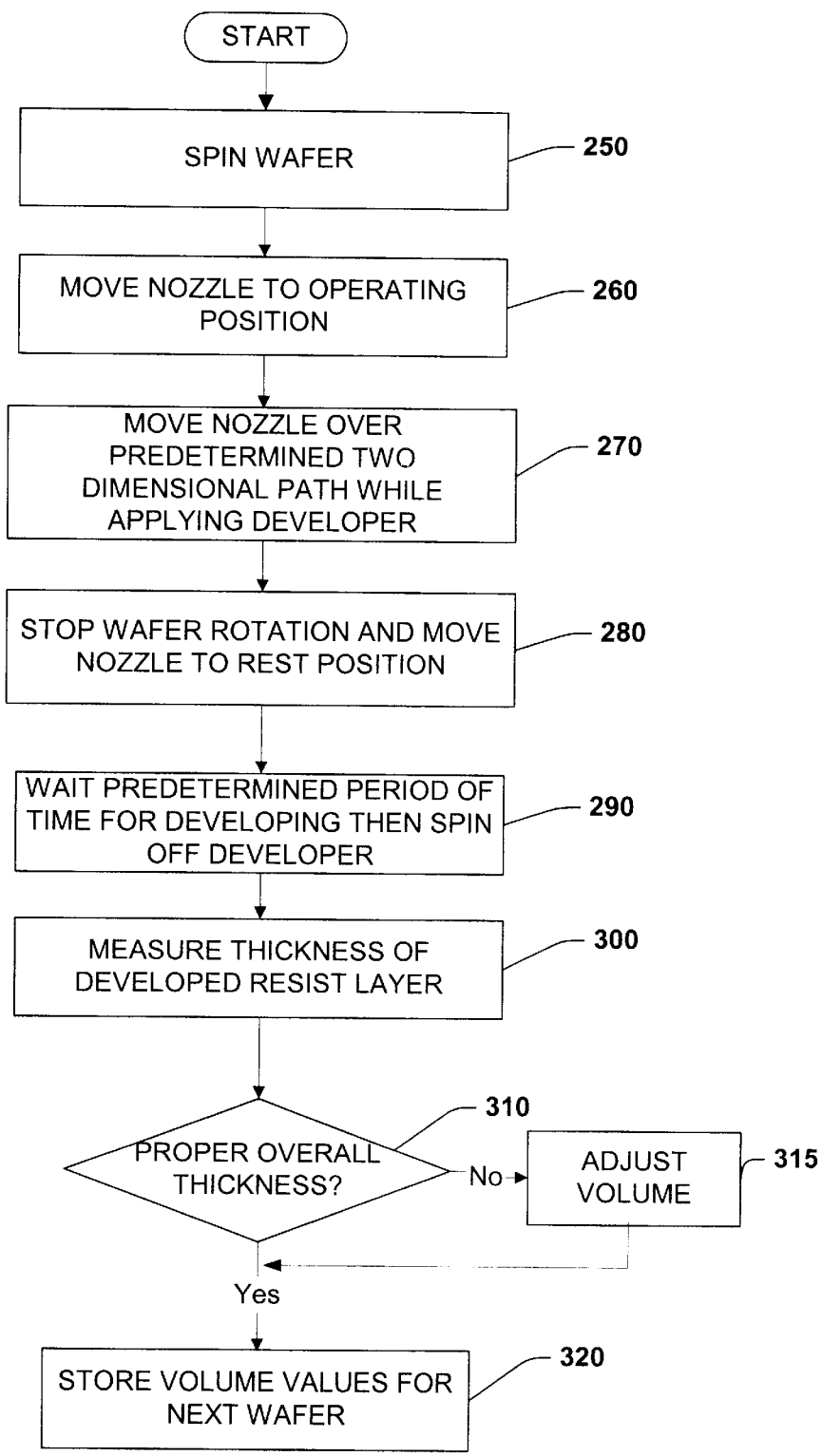
FIG. 8 is a flow diagram illustrating one specific methodology for carrying out the volume control system in accordance with the present invention.

After the optimal path is found, further adjustment of the path can result in a less uniformly developed photoresist material layer 50. Therefore, further adjustments can be affected by adjusting the volume after the optimal path has been determined. FIG. 8 is a flow diagram illustrating one particular methodology for carrying out the present invention with respect to adjusting the volume after the optimal path has been found in FIG. 7. In step 250, the test wafer 52 with the photoresist material layer 50 is rotated on the rotating chuck 54, and the processor 64 performs a general initialization routine to the developer application system 60. In step 260, the nozzle 40 is moved to its operating position over the center of the photoresist material layer 50. In step 270, the nozzle 40 is moved along a predetermined two dimensional path while applying developer along the path to the photoresist material layer 50. In step 280, the motor 120 is stopped, causing the wafer 52 and photoresist material layer 50 to stop rotating and the nozzle 40 is moved to its rest position. In step 290, the system 60 waits a predetermined amount of time until the developing of the photoresist material layer 50 is complete, and then rotates the wafer 52 to spin off the developer. The measurement system 72 then measures the thickness of the developed photoresist material layer 50 on the wafer 52 at various locations along the wafer 52 in step 300. In step 310, the processor 64 compares the measured thickness uniformity with the desired thickness uniformity, and determines whether or not the proper thickness uniformity has been achieved within predefined tolerances. If no, the processor 64 enters an adjustment routine to adjust the volume of the developer distributed across the optimal path in step 315. In step 320, the processor 64 stores the previous or adjusted volume values to be used for the next wafer.

Figure 9:
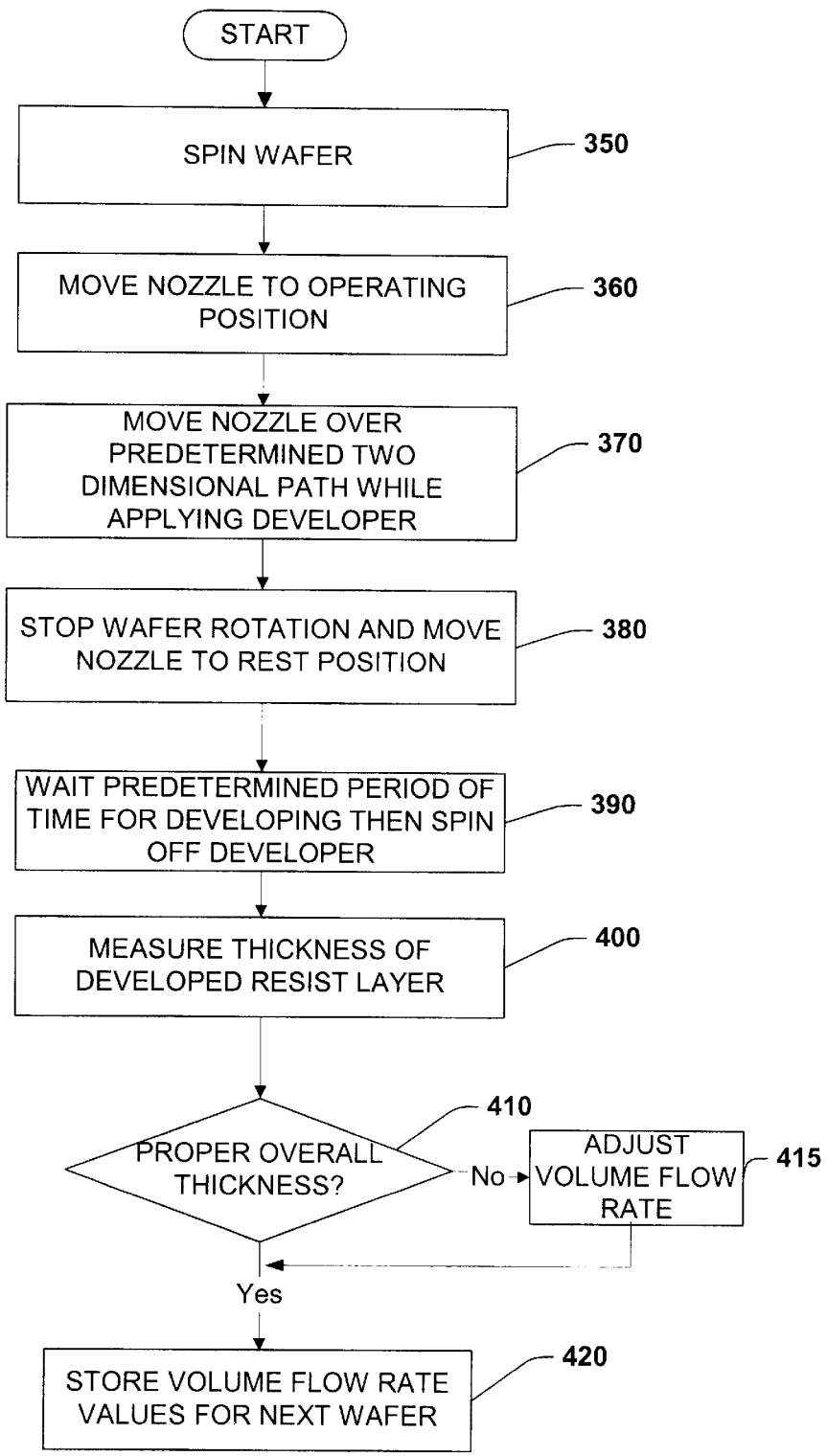
FIG. 9 is a flow diagram illustrating another specific methodology for carrying out the volume control system in accordance with the present invention.

FIG. 9 is a flow diagram illustrating another particular methodology for carrying out the present invention with respect to adjusting the volume flow rate after the optimal path has been found in FIG. 7. In step 350, the test wafer 52 with the photoresist material layer 50 is rotated on the rotating chuck 54, and the processor 64 performs a general initialization routine to the developer application system 60. In step 360, the nozzle 40 is moved to its operating position over the center of the photoresist material layer 50. In step 370, the nozzle 40 is moved along a predetermined two dimensional path while applying developer along the path to the photoresist material layer 50. In step 380, the motor 120 is stopped, causing the wafer 52 and photoresist material layer 50 to stop rotating and the nozzle 40 is moved to its rest position. In step 390, the system 60 waits a predetermined amount of time until the developing of the photoresist material layer 50 is complete, and then rotates the wafer 52 to spin off the developer. The measurement system 72 then measures the thickness of the developed photoresist material layer 50 on the wafer 52 at various locations along the wafer 52 in step 400. In step 410, the processor 64 compares the measured thickness uniformity with the desired thickness uniformity, and determines whether or not the proper thickness uniformity has been achieved within predefined tolerances. If no, the processor 64 enters an adjustment routine to adjust the volume flow rate of the developer distributed across the optimal path in step 415. In step 420, the processor 64 stores the previous or adjusted volume flow rate values to be used for the next wafer.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for applying a developer material onto a photoresist material layer disposed on a substrate to provide a uniformly thick layer of developer material, the developer material being spincoated onto the substrate by a rotating chuck coupled to a motor to form the uniformly thick layer of developer material, the method comprising the steps of:

spinning the photoresist material layer at a predetermined speed;

moving a nozzle to an operating position in a center region of the photoresist material layer;

moving the nozzle along a predetermined path in two dimensions while applying the developer material;

spin coating the substrate until the developer forms a layer on the photoresist material layer;

stopping the spinning of the substrate until the developer develops the photoresist material layer;

measuring the thickness of the developed photoresist material layer at a variety of areas on the photoresist material layer and generating data based on the measurements;

determining a thickness uniformity of the layer based on the data; and reconfiguring the predetermined path, so that a developed layer of photoresist material having a more uniform thickness can be achieved for a subsequent substrate.

2. The method of claim 1, further including the step of adjusting a volume of the developer material applied along the predetermined path.

3. The method of claim 1, further including the step of adjusting a volume flow rate of the developer material applied along the predetermined path.

4. A method for applying a developer material onto a photoresist material layer disposed on a substrate to provide a uniformly thick layer of developer material, the developer material being spincoated onto the substrate by a rotating chuck coupled to a motor to form the uniformly thick layer of developer material, the method comprising the steps of:

spinning the photoresist material layer coated substrate at a predetermined speed;

moving a nozzle to an operating position in a center region of the photoresist material layer;

moving the nozzle along a predetermined path in two dimensions while applying the developer material and adjusting a volume flow rate of the developer material applied along the predetermined path;

spin coating the substrate until the developer forms a layer on the photoresist material layer;

stopping the spinning of the substrate until the developer develops the photoresist material layer;

measuring the thickness of the developed photoresist material layer at a variety of areas on the photoresist material layer and generating data based on the measurements;

determining a thickness uniformity of the layer based on the data; and reconfiguring the predetermined path, so that a developed layer of photoresist material having a more uniform thickness can be achieved for a subsequent substrate.

5. The method of claim 4, further comprising spinning off any remaining developer.

6. A method for applying a developer material onto a photoresist material layer disposed on a substrate to provide a uniformly thick layer of developer material, the developer material being spincoated onto the substrate by a rotating chuck coupled to a motor to form the uniformly thick layer of developer material, the method comprising the steps of:

spinning the photoresist material layer coated substrate at a predetermined speed;

moving a nozzle to an operating position in a center region of the photoresist material layer;

moving the nozzle along a predetermined path in two dimensions while applying the developer material and adjusting a volume of the developer material applied along the predetermined path;

spin coating the substrate until the developer forms a layer on the photoresist material layer;

stopping the spinning of the substrate until the developer develops the photoresist material layer;

measuring the thickness of the developed photoresist material layer at a variety of areas on the photoresist material layer and generating data based on the measurements;

determining a thickness uniformity of the layer based on the data; and reconfiguring the predetermined path, so that a developed layer of photoresist material having a more uniform thickness can be achieved for a subsequent substrate.

7. The method of claim 6, further comprising spinning off any remaining developer.

* * * * *